United States Patent
Ko

(10) Patent No.: US 8,992,278 B2
(45) Date of Patent: Mar. 31, 2015

(54) SUBSTRATE ATTACHMENT DEVICE OF DISPLAY DEVICE AND METHOD FOR MANUFACTURING DISPLAY DEVICE USING THE SAME

(71) Applicant: LG Display Co., Ltd., Seoul (KR)

(72) Inventor: Youngjo Ko, Busan (KR)

(73) Assignee: LG Display Co., Ltd., Seoul (KR)

( * ) Notice: Subject to any disclaimer, the term of this patent is extended or adjusted under 35 U.S.C. 154(b) by 106 days.

(21) Appl. No.: 13/969,725

(22) Filed: Aug. 19, 2013

(65) Prior Publication Data
US 2014/0179191 A1  Jun. 26, 2014

(30) Foreign Application Priority Data
Dec. 26, 2012 (KR) .......... 10-2012-0152785

(51) Int. Cl.
*G02F 1/1333* (2006.01)
*G02F 1/13* (2006.01)
*H01L 21/00* (2006.01)

(52) U.S. Cl.
CPC ........ *G02F 1/1303* (2013.01); *G02F 1/133305* (2013.01); *H01L 21/00* (2013.01)
USPC .............................................. 445/25; 445/24

(58) Field of Classification Search
CPC  G02F 1/1303; G02F 1/1333; G02F 1/133305
USPC .......................................................... 445/25
See application file for complete search history.

(56) References Cited

U.S. PATENT DOCUMENTS

| | | | |
|---|---|---|---|
| 2002/0027636 A1* | 3/2002 | Yamada ........................ | 349/155 |
| 2006/0204675 A1* | 9/2006 | Gao et al. ........................ | 428/1.1 |
| 2006/0279679 A1* | 12/2006 | Fujisawa et al. .............. | 349/116 |
| 2009/0149104 A1* | 6/2009 | Tsai et al. ........................ | 445/25 |
| 2009/0161048 A1* | 6/2009 | Satake et al. .................. | 349/110 |
| 2009/0284904 A1* | 11/2009 | Wu et al. .................. | 361/679.01 |
| 2011/0120619 A1* | 5/2011 | Harada et al. .................... | 156/64 |

* cited by examiner

*Primary Examiner* — Mary Ellen Bowman
(74) *Attorney, Agent, or Firm* — Morgan, Lewis & Bockius LLP

(57) ABSTRACT

A substrate attachment device of a display device and a method for manufacturing the display device using the same are disclosed. The substrate attachment device of the display device includes a guide unit which is curvedly disposed, a first support unit which moves forward and backwards along the guide unit and transfers a cover substrate having a curved surface, a second support unit which is disposed on the guide unit, moves forward and backwards, and transfers a display panel, and a roller unit which rotates so that the cover substrate having the curved surface is attached to the display panel.

16 Claims, 7 Drawing Sheets

(a)

(b)

(a)        (b)

SUBSTRATE ATTACHMENT DEVICE OF DISPLAY DEVICE AND METHOD FOR MANUFACTURING DISPLAY DEVICE USING THE SAME

This application claims the benefit of priority of Korean Patent Application No. 10-2012-0152785 filed on Dec. 26, 2012, the entire contents of which is incorporated herein by reference for all purposes as if fully set forth herein.

BACKGROUND OF THE INVENTION

1. Field of the Invention

Embodiments of the invention relate to a substrate attachment device of a display device and a method for manufacturing the display device using the same.

2. Discussion of the Related Art

The market of flat panel displays used as media between users and information is increasing with the development of information technology. Hence, the use of flat panel displays, such as an organic light emitting display, a liquid crystal display (LCD), an electrophoretic display, and a plasma display panel (PDP), is increasing.

Out of the above flat panel displays, the organic light emitting display, the liquid crystal display, and the electrophoretic display may be used as a flexible display by adding flexibility to them. Hence, in the flat panel displays, various studies including a method for displaying an image on a display panel, which is formed in the form of a curved surface, are being continuously carried out.

The method for displaying the image on the display panel after the display panel is formed in the form of the curved surface is substantially the same as a method used in an existing flat panel display. Only, the method for displaying the image on the curved display panel is different from the existing method in that a substrate may be formed of metal, plastic, etc. instead of glass.

However, there is no lamination equipment for attaching a curved cover substrate to the display panel so as to manufacture the curved display panel in a related art. Thus, in the related art, the curved cover substrate was attached to the display panel using a roller-to-stage manner used to manufacture a flat display panel.

However, when the curved cover substrate is attached to the display panel using the related art equipment, bubbles are generated between the display panel and the curved cover substrate. Even when a defoamation process is performed on the bubbles generated between the display panel and the curved cover substrate, the bubbles are not easily removed. Thus, a method for solving the problem is required.

SUMMARY OF THE INVENTION

In one aspect, there is a substrate attachment device of a display device comprising a guide unit which is curvedly disposed, a first support unit configured to move forward and backwards along the guide unit and transfer a cover substrate having a curved surface, a second support unit which is disposed on the guide unit, moves forward and backwards, and transfers a display panel, and a roller unit configured to rotate so that the cover substrate having the curved surface is attached to the display panel.

In another aspect, there is a method for manufacturing a display device using a substrate attachment device of the display device, the method comprising forming subpixels on one surface of a flexible substrate, attaching a protection film to the one surface of the flexible substrate to form a display panel, loading a cover substrate having a curved surface to be attached to the display panel on a first support unit, which moves along a curvedly positioned guide unit, loading the display panel on a second support unit, transferring the first and second support units to a process region, and rotating a roller unit so that the cover substrate having the curved surface is attached to the display panel when the first and second support units approach the process region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Exemplary embodiments of the invention will be described with reference to FIGS. 1 to 13.

First Embodiment

Figure 1:
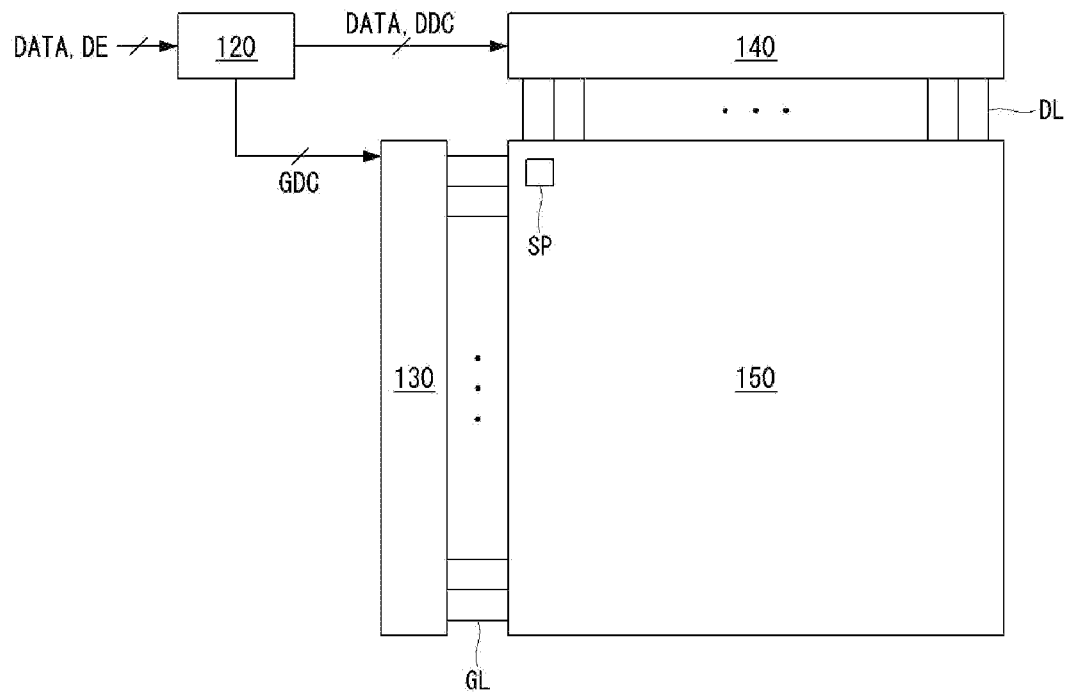
FIG. 1 is a schematic block diagram of a flexible display according to an exemplary embodiment of the invention.
Figure 2:
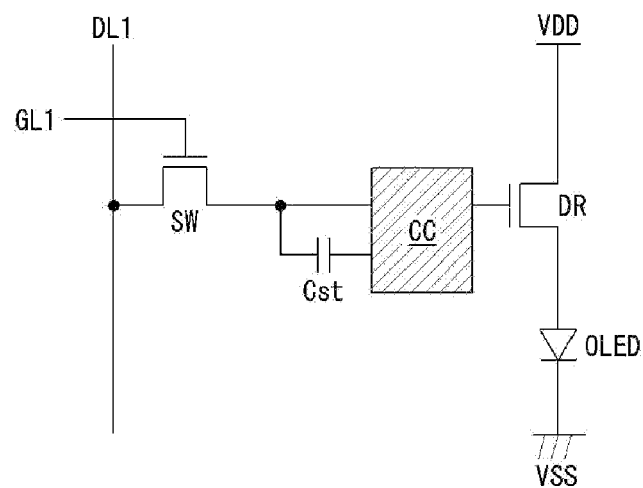
FIG. 2 illustrates an example of a subpixel shown in FIG. 1.
Figure 3:
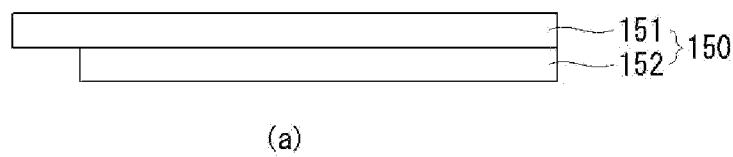
FIG. 3 is a cross-sectional view of a display panel shown in FIG. 1.
Figure 3:
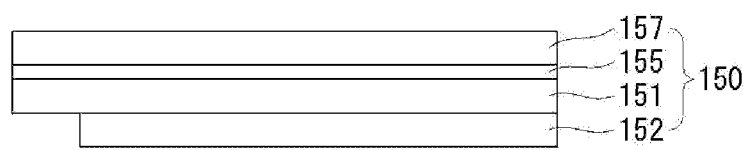
Figure 4:
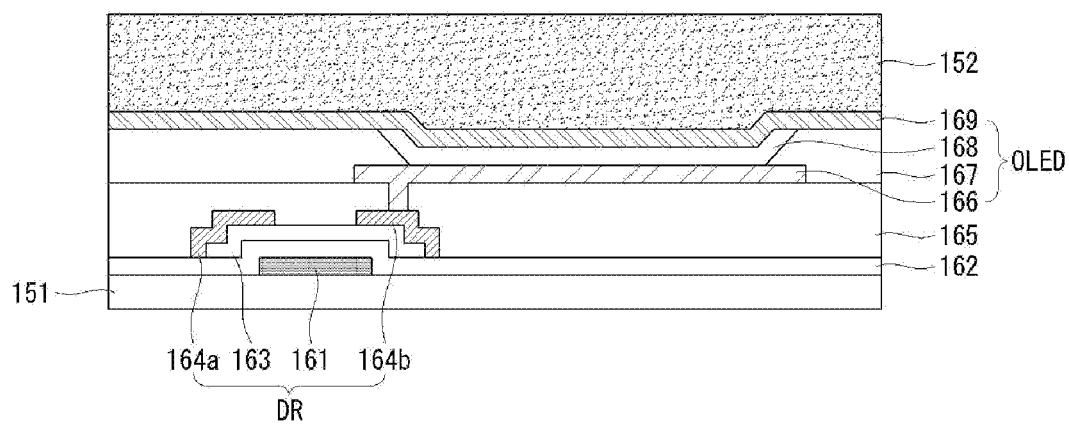
FIGS. 4 and 5 illustrate examples of a cross-sectional structure of a subpixel configured as an organic light emitting element.
Figure 5:
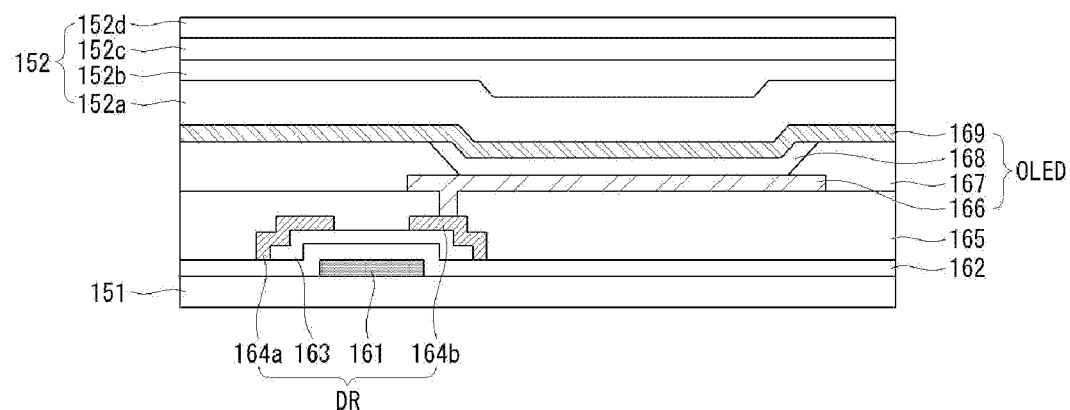
Figure 6:
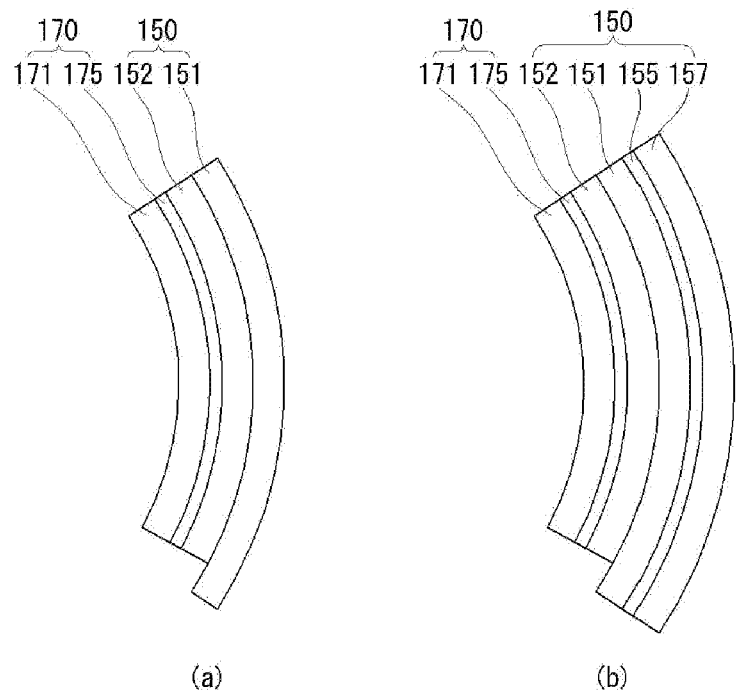
FIG. 6 is a cross-sectional view of a curved display panel according to an exemplary embodiment of the invention.

FIG. 1 is a schematic block diagram of a flexible display according to an exemplary embodiment of the invention. FIG. 2 illustrates an example of a subpixel shown in FIG. 1. FIG. 3 is a cross-sectional view of a display panel shown in FIG. 1. FIGS. 4 and 5 illustrate examples of a cross-sectional structure of a subpixel configured as an organic light emitting element. FIG. 6 is a cross-sectional view of a curved display panel according to the embodiment of the invention.

As shown in FIG. 1, the flexible display according to the embodiment of the invention includes a timing controller 120, a gate driver 130, a data driver 140, and a display panel 150.

The timing controller 120 collects extended display identification data (EDID) including a resolution, a frequency, timing information, etc. of the display panel 150 or compensation data from an external memory through I²C interface, etc. The timing controller 120 outputs a gate timing control signals GDC for controlling operation timing of the gate driver 130 and a data timing control signals DDC for controlling operation timing of the data driver 140. The timing controller 120 supplies the data timing control signals DDC and a digital data signal DATA to the data driver 140.

The data driver 140 samples and latches the digital data signal DATA in response to the data timing control signals DDC received from the timing controller 120 and converts the latched digital data signal DATA into analog data signals using gamma reference voltages. The data driver 140 then outputs the analog data signals. The data driver 140 is configured as integrated circuits (ICs). The data driver 140 may be surface-mounted on the display panel 150 or may be mounted on an external substrate connected to the display panel 150. The data driver 140 supplies the analog data signals to subpixels SP included in the display panel 150 through data lines DL.

The gate driver 130 shifts a level of a gate voltage in response to the gate timing control signals GDC received from the timing controller 120 and outputs a gate signal. The gate driver 130 is configured as integrated circuits (ICs). The gate driver 130 may be surface-mounted on the display panel 150 or may be mounted on an external substrate connected to the display panel 150. Alternatively, the gate driver 130 configured as the integrated circuits may be formed on the display panel 150 in the form of a gate-in panel (GIP). The gate driver 130 supplies the gate signal to the subpixels SP included in the display panel 150 through gate lines GL.

The display panel 150 displays an image corresponding to the gate signal received from the gate driver 130 and the analog data signal received from the data driver 140. The display panel 150 includes the subpixels SP, which control light to display the image. Each of the subpixels SP included in the display panel 150 may be implemented as an organic light emitting element, a liquid crystal display element, and an electrophoresis display element. Hereinafter, the embodiment of the invention is described using the organic light emitting element as an example of the subpixel SP.

As shown in FIG. 2, the subpixel SP configured as the organic light emitting element includes a switching transistor SW, a capacitor Cst, a driving transistor DR, a compensation circuit CC, and an organic light emitting diode OLED. The switching transistor SW transmits an analog data signal supplied through a data line DL1 to the capacitor Cst in response to a gate signal supplied through a gate line GL1. The capacitor Cst stores the analog data signal as a data voltage. The driving transistor DR is driven, so that a driving current flows between a first power supply line VDD and a second power supply line VSS based on the data voltage stored in the capacitor Cst. The organic light emitting diode OLED emits light corresponding to the driving current supplied through the driving transistor DR. The compensation circuit CC compensates for a threshold voltage of the driving transistor DR. The compensation circuit CC includes at least one transistor and at least one capacitor. The compensation circuit CC may have various configurations, and a further description thereof may be briefly made or may be entirely omitted.

The subpixel configured as the organic light emitting element generally has a configuration of 2T(transistor)1C(capacitor) including a switching transistor, a capacitor, a driving transistor, and an organic light emitting diode. If a compensation circuit is added, the subpixel may have configurations of 3T1C, 4T2C, 5T2C, etc. The subpixel having the above-described configuration may be classified into a top emission type subpixel, a bottom emission type subpixel, and a dual emission type subpixel based on its structure.

The subpixel configured as the organic light emitting element may have a subpixel structure including a white subpixel, a red subpixel, a green subpixel, and a blue subpixel, so as to increase its light efficiency and prevent a reduction in a luminance and color sensitivity of a pure color. In this instance, the white subpixel, the red subpixel, the green subpixel, and the blue subpixel may be implemented using a white organic light emitting diode and red, green, and blue color filters or may be implemented by dividing a light emitting material included in an organic light emitting diode into white, red, green, and blue light emitting materials.

As shown in FIG. 3, the display panel 150 includes a flexible substrate 151, a protection film 152, an adhesive member 155, and a support substrate 157. The flexible substrate 151 may be formed of a material having an excellent restitution force by adding flexibility to it, for example, polyethersulfone (PES), polyethylene terephthalate (PET), polyethylene naphthalate (PEN), polyimide (PI), or polycarbonates (PC). Other materials may be used.

The subpixels configured as the organic light emitting elements are formed on one surface (or a front surface) of the flexible substrate 151. The subpixels configured as the organic light emitting elements are weak in an external environment such as oxygen and moisture. Thus, the protection film 152 or a flexible protection film capable of sealing the organic light emitting elements is attached to the flexible substrate 151.

The adhesive member 155 functions to attach the flexible substrate 151 to the support substrate 157. The adhesive member 155 may be selected as a double-sided tape, an adhesive, etc. The embodiment of the invention is not limited thereto. The adhesive member 155 may have a black-based color, so as to improve a luminance of the display panel 150. However, other colors may be used. For example, the adhesive member 155 may have a transparent-based color.

The support substrate 157 is attached to the other surface (or a back surface) of the flexible substrate 151 so as to increase flexibility and rigidity of the flexible substrate 151. The support substrate 157 may be formed of a resin material similar to or the same resin material as the flexible substrate 151. Alternatively, the support substrate 157 may be formed of a metal material such as aluminum and stainless steel (SUS304). On the other hand, the support substrate 157 may be omitted depending on the material or the function of the flexible substrate 151. In FIG. 3, (a) shows the display panel 150 in which the support substrate 157 is omitted, and (b) shows the display panel 150 to which the support substrate 157 is added.

An exemplary structure of the subpixel SP configured as the organic light emitting element is described below with reference to FIGS. 4 and 5.

The driving transistor DR and the organic light emitting diode OLED are formed on the one surface of the flexible substrate 151. The driving transistor DR includes a gate electrode 161, a semiconductor layer 163, a source electrode 164*a*, and a drain electrode 164*b*. The gate electrode 161 is formed on the one surface of the flexible substrate 151. A first insulating layer 162 is formed on the gate electrode 161. The semiconductor layer 163 is formed on the first insulating layer 162. The source electrode 164a and the drain electrode 164b respectively contact both sides of the semiconductor layer 163. A second insulating layer 165 is formed on the source electrode 164a and the drain electrode 164b. In addition to the driving transistor DR, a switching transistor (not shown), a capacitor (not shown), various lines, etc. are formed on the one surface of the flexible substrate 151.

The organic light emitting diode OLED includes a lower electrode 166, an organic light emitting layer 168, and an upper electrode 169. The lower electrode 166 is formed on the second insulating layer 165. The lower electrode 166 is connected to the drain electrode 164b of the driving transistor DR exposed through the second insulating layer 165. The lower electrode 166 is formed in each subpixel. The lower electrode 166 is selected as an anode electrode or a cathode electrode. A bank layer 167 is formed on the lower electrode 166. The bank layer 167 is a layer defining an opening of the subpixel. The organic light emitting layer 168 is formed on the lower electrode 166.

The organic light emitting layer 168 includes a hole injection layer HIL, a hole transport layer HTL, a light emitting layer EML, an electron transport layer ETL, and an electron injection layer EIL. At least one of the other functional layers HIL, HTL, ETL, and EIL except the light emitting layer EML of the organic light emitting layer 168 may be omitted. The organic light emitting layer 168 may further include a blocking layer or a barrier layer for adjusting energy levels of holes and electrons. The upper electrode 169 is formed on the organic light emitting layer 168. The upper electrode 169 is a common electrode commonly connected to all of the subpixels SP. The upper electrode 169 is selected as a cathode electrode or an anode electrode.

The protection film 152 is formed on the upper electrode 169. As shown in FIG. 4, the protection film 152 may have a single-layered structure. In this instance, the protection film 152 may be formed of a transparent face sealant or a transparent film. Alternatively, as shown in FIG. 5, the protection film 152 may have a multi-layered structure. In this instance, the protection film 152 may be formed of an organic-inorganic complex layer including an organic layer 152a, an inorganic layer 152b, an organic layer 152c, and an inorganic layer 152d. Although not shown, the organic-inorganic complex layer may further include an absorption layer for absorbing moisture or oxygen.

As described above, the subpixels SP are formed on the one surface of the flexible substrate 151 and the protection film 152 is attached to the one surface of the flexible substrate 151, thereby forming the display panel 150.

As shown in FIG. 6, the display panel 150 has a curved surface by attaching a cover substrate 170 to the display panel 150. The cover substrate 170 includes a transparent adhesive layer 175 and a transparent window layer 171 having a curved surface. In FIG. 6, (a) is a cross-sectional view of the cover substrate 170 attached to the display panel 150 having the structure shown in (a) of FIG. 3, and (b) is a cross-sectional view of the cover substrate 170 attached to the display panel 150 having the structure shown in (b) of FIG. 3.

As shown in FIG. 6, because the display panel 150 is flexible, the display panel 150 has the curved surface when the cover substrate 170 having the curved surface is attached to the display panel 150. When the cover substrate 170 having the curved surface is attached to the display panel 150 using a related art equipment, bubbles are generated between the display panel 150 and the curved cover substrate 170. Thus, even when a defoamation process is performed on the bubbles between the display panel 150 and the curved cover substrate 170 generated by the use of the related art equipment, the bubbles are not easily removed.

A first embodiment of the invention may easily attach the cover substrate 170 having the curved surface to the display panel 150 using a substrate attachment device, thereby minimizing the possibility of generation of the bubbles between the display panel 150 and the cover substrate 170. This is will be described in detail below.

Figure 7:
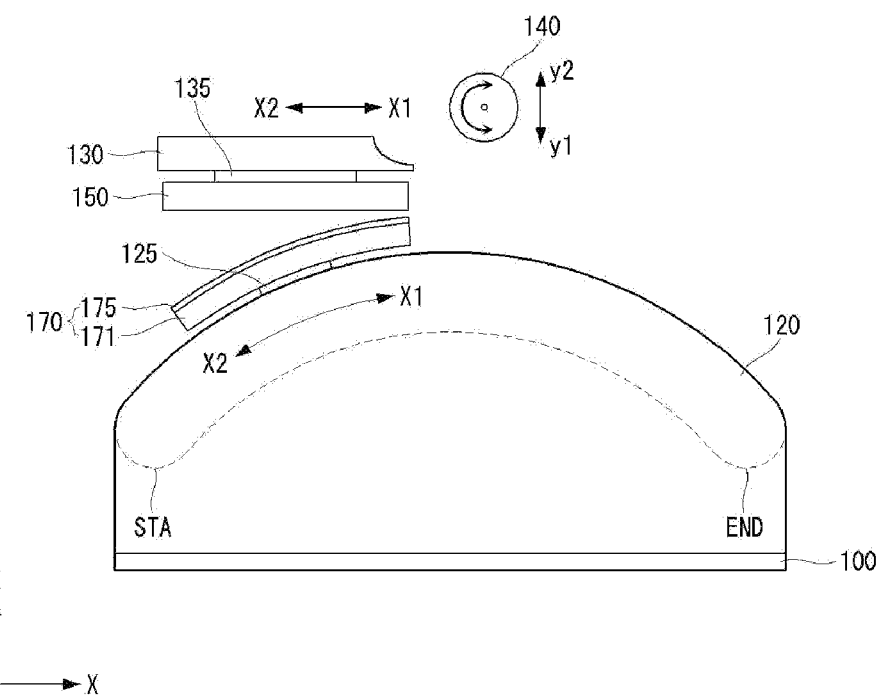
FIG. 7 schematically illustrates a configuration of a substrate attachment device of a display device according to a first embodiment of the invention.
Figure 8:
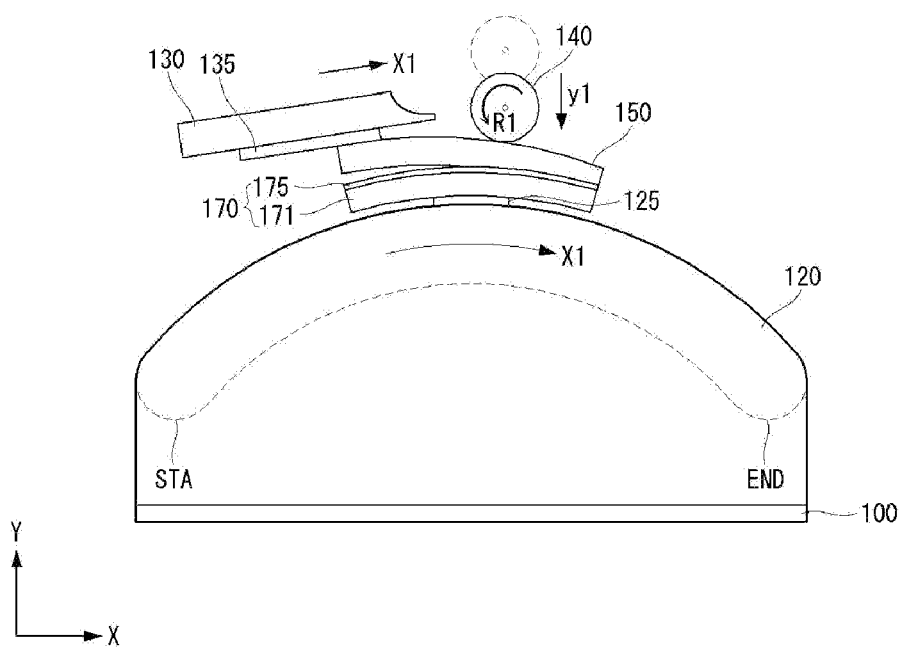
FIG. 8 illustrates a lamination process using the substrate attachment device of the display device according to the first embodiment of the invention.

FIG. 7 schematically illustrates a configuration of a substrate attachment device of a display device according to the first embodiment of the invention. FIG. 8 illustrates a lamination process using the substrate attachment device of the display device according to the first embodiment of the invention.

The substrate attachment device of the display device according to the first embodiment of the invention includes a base unit 100, a guide unit 120, a first support unit 125, a second support unit 130, and a roller unit 140.

The guide unit 120 is installed on the base unit 100. The guide unit 120 has a flat lower part and a semicircular upper part (i.e., a curved upper part). The upper part of the guide unit 120 includes a pair of curve rails.

The first support unit 125 is installed on the guide unit 120. More specifically, the first support unit 125 is installed on the pair of curve rails formed on the upper part of the guide unit 120. The first support unit 125 includes wheels rotating on the pair of curve rails or includes a self-module performing a contactless movement on the pair of curve rails. A method for forming the first support unit 125 including the wheels or the self-module may be readily designed by those skilled in the art, and thus a further description may be briefly made or may be entirely omitted. The first support unit 125 moves forward in x1-direction or moves backwards in x2-direction along the guide unit 120 using electric power of the first support unit 125. The first support unit 125 loads the cover substrate 170 at a start point STA and releases the display panel 150 and the cover substrate 170, which are attached to each other, at an end point END. The first support unit 125 functions to move the curved cover substrate 170. The upper part of the first support unit 125 may have the same curved surface as the cover substrate 170. The embodiment of the invention is not limited thereto. The first support unit 125 may include an adsorption part for adsorbing the curved cover substrate 170, but the adsorption part may be omitted.

The second support unit 130 is installed on the guide unit 120. More specifically, the second support unit 130 may be installed in a floating state by a holder installed separately from the guide unit 120 or by a holder installed along with the guide unit 120. The embodiment of the invention is not limited thereto. The second support unit 130 moves forward in the x1-direction or moves backwards in the x2-direction in synchronization with the first support unit 125. The second support unit 130 functions to move the display panel 150. The second support unit 130 may have a flat lower surface in the same manner as the display panel 150. The second support unit 130 includes an adsorption part 135 for adsorbing the display panel 150 on a lower part of the second support unit 130. The adsorption part 135 may adsorb the display panel 150 in a vacuum adsorption manner. The embodiment of the invention is not limited thereto.

The roller unit 140 is installed on the guide unit 120. More specifically, the roller unit 140 may be installed in a floating state by a driver installed separately from the guide unit 120 or by a driver installed along with the guide unit 120. The embodiment of the invention is not limited thereto. The roller unit 140 moves downwards in y1-direction or moves upwards in y2-direction. The roller unit 140 is positioned in a standby region positioned in the y2-direction, but the roller unit 140 moves to a process region positioned in the y1-direction when the curved cover substrate 170 and the display panel 150 approach the roller unit 140. The roller unit 140 rotates, so that the curved cover substrate 170 is attached to the display panel 150.

A process for attaching the curved cover substrate 170 and the display panel 150 using the substrate attachment device of the display device according to the first embodiment of the invention is described below with reference to FIG. 8.

The curved cover substrate 170 is loaded on the first support unit 125, and the display panel 150 is loaded on the second support unit 130. When the curved cover substrate 170 and the display panel 150 are loaded on the first and second support units 125 and 130, the curved cover substrate 170 and the display panel 150 are aligned with each other. A vision camera may be used to align the curved cover substrate 170 and the display panel 150. The embodiment of the invention is not limited thereto. Namely, the substrate attachment device according to the first embodiment of the invention includes the vision camera. However, because the vision camera may be readily understood by those skilled in the art, the vision camera was not shown in the drawings.

The first and second support units 125 and 130 move in the x1-direction so as to transfer the curved cover substrate 170 and the display panel 150 loaded thereon to the process region of the roller unit 140. When the curved cover substrate 170 and the display panel 150 approach the roller unit 140 through the movement of the first and second support units 125 and 130, the roller unit 140 moves downwards in the y1-direction and thus moves from the standby region to the process region. The roller unit 140 rotates in R1-direction, so that the curved cover substrate 170 is attached to the display panel 150 using the adhesive layer 175. After the process for attaching the curved cover substrate 170 and the display panel 150 is completed, the first support unit 125 transfers the curved cover substrate 170 and the display panel 150 to the end point END. In this instance, the second support unit 130 moves up to the process region of the roller unit 140.

As described above, the curved cover substrate 170 is attached to the display panel 150 using the substrate attachment device according to the first embodiment of the invention, and thus the display panel 150 having the curved surface may be manufactured as shown in FIG. 6.

Second Embodiment

Figure 9:
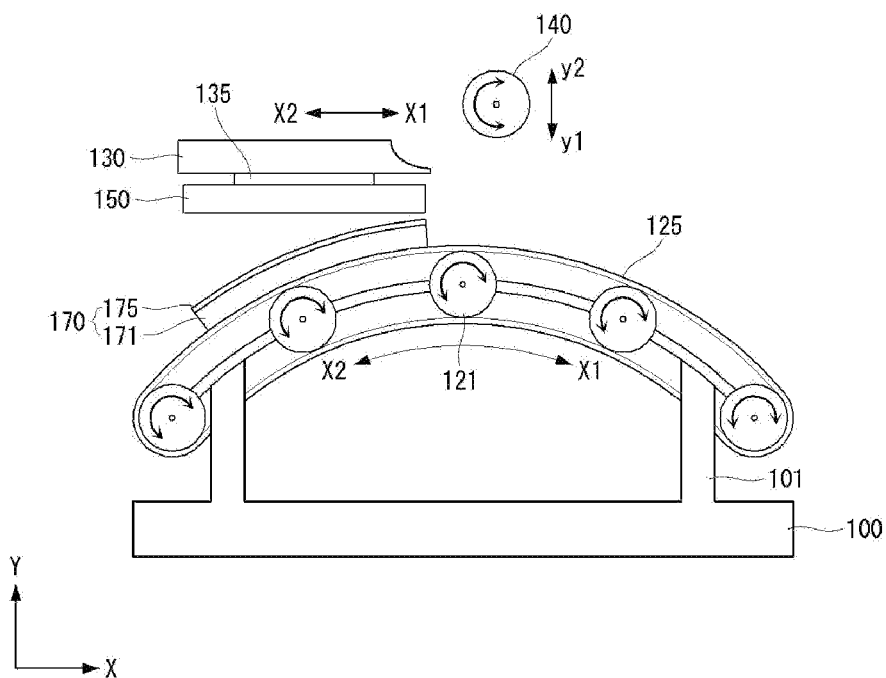
FIG. 9 schematically illustrates a configuration of a substrate attachment device of a display device according to a second embodiment of the invention.
Figure 10:
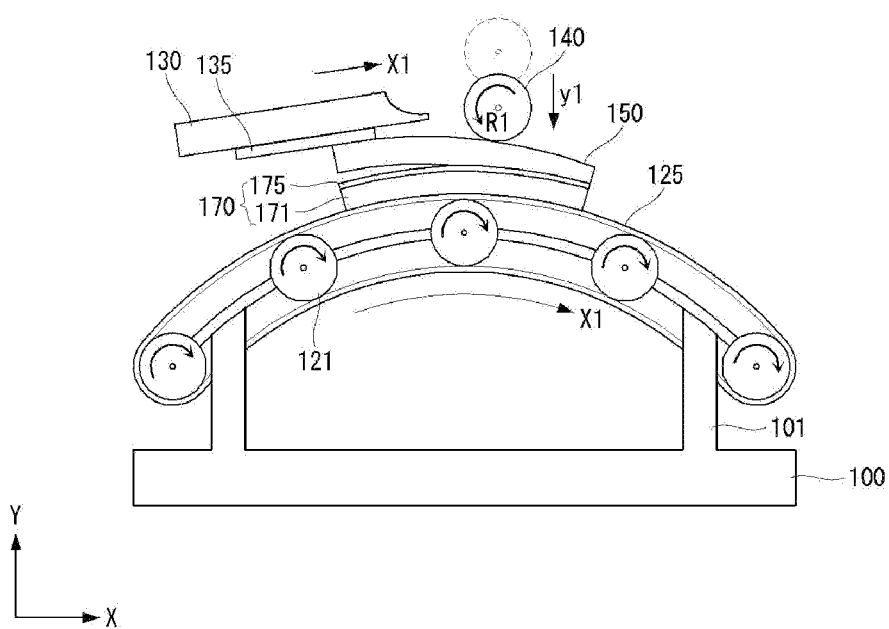
FIG. 10 illustrates a lamination process using the substrate attachment device of the display device according to the second embodiment of the invention.

FIG. 9 schematically illustrates a configuration of a substrate attachment device of a display device according to a second embodiment of the invention. FIG. 10 illustrates a lamination process using the substrate attachment device of the display device according to the second embodiment of the invention.

The substrate attachment device of the display device according to the second embodiment of the invention includes a base unit 100, a guide unit 121, a first support unit 125, a second support unit 130, and a roller unit 140.

The guide unit 121 is installed on a fixing unit 101 vertically protruding from the base unit 100. The guide unit 121 includes a pair of caterpillar rails. The pair of caterpillar rails include track rails and wheels. The pair of caterpillar rails have a semicircular curve shape and are fixed to the fixing unit 101. The pair of caterpillar rails receive electric power from a motor or a gear, etc. and rotate.

The first support unit 125 is installed on the guide unit 121. The first support unit 125 includes a belt rotating along the caterpillar rails of the guide unit 121. The belt of the first support unit 125 may be formed of a rubber. Other materials may be used for the belt. The first support unit 125 moves forward in x1-direction or moves backwards in x2-direction depending on the rotation of the guide unit 121. The first support unit 125 rotates along the caterpillar rails of the guide unit 121 and thus has a curved surface.

The second support unit 130 is installed on the guide unit 121. More specifically, the second support unit 130 may be installed in a floating state by a holder installed separately from the guide unit 121 or by a holder installed along with the guide unit 121. The embodiment of the invention is not limited thereto. The second support unit 130 moves forward in the x1-direction or moves backwards in the x2-direction in synchronization with the first support unit 125. The second support unit 130 functions to move the display panel 150. The second support unit 130 may have a flat lower surface in the same manner as the display panel 150. The second support unit 130 includes an adsorption part 135 for adsorbing the display panel 150 on a lower part of the second support unit 130. The adsorption part 135 may adsorb the display panel 150 in a vacuum adsorption manner. The embodiment of the invention is not limited thereto.

The roller unit 140 is installed on the guide unit 121. More specifically, the roller unit 140 may be installed in a floating state by a driver installed separately from the guide unit 121 or by a driver installed along with the guide unit 121. The embodiment of the invention is not limited thereto. The roller unit 140 moves downwards in y1-direction or moves upwards in y2-direction. The roller unit 140 is positioned in a standby region positioned in the y2-direction, but the roller unit 140 moves to a process region positioned in the y1-direction when the curved cover substrate 170 and the display panel 150 approach the roller unit 140. The roller unit 140 rotates, so that the curved cover substrate 170 is attached to the display panel 150.

A process for attaching the curved cover substrate 170 and the display panel 150 using the substrate attachment device of the display device according to the second embodiment of the invention is described below with reference to FIG. 10.

The curved cover substrate 170 is safely placed on the first support unit 125, and the display panel 150 is loaded on the second support unit 130. When the curved cover substrate 170 and the display panel 150 are loaded on the first and second support units 125 and 130, the curved cover substrate 170 and the display panel 150 are aligned with each other. A vision camera may be used to align the curved cover substrate 170 and the display panel 150. The embodiment of the invention is not limited thereto. Namely, the substrate attachment device according to the second embodiment of the invention includes the vision camera. However, because the vision camera may be readily understood by those skilled in the art, the vision camera was not shown in the drawings.

The first and second support units 125 and 130 move in the x1-direction so as to transfer the curved cover substrate 170 and the display panel 150 loaded thereon to the process region of the roller unit 140. When the curved cover substrate 170 and the display panel 150 approach the roller unit 140 through the movement of the first and second support units 125 and 130, the roller unit 140 moves downwards in the y1-direction and thus moves from the standby region to the process region. The roller unit 140 rotates in R1-direction, so that the curved cover substrate 170 is attached to the display panel 150 using the adhesive layer 175.

As described above, the curved cover substrate 170 is attached to the display panel 150 using the substrate attachment device according to the second embodiment of the invention, and thus the display panel 150 having the curved surface may be manufactured as shown in FIG. 6.

Third Embodiment

Figure 11:
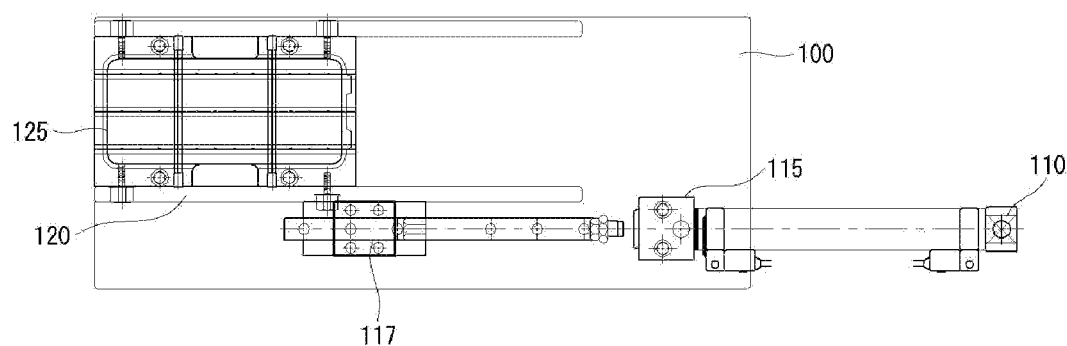
FIGS. 11 and 12 schematically illustrate a configuration of a substrate attachment device of a display device according to a third embodiment of the invention.
Figure 12:
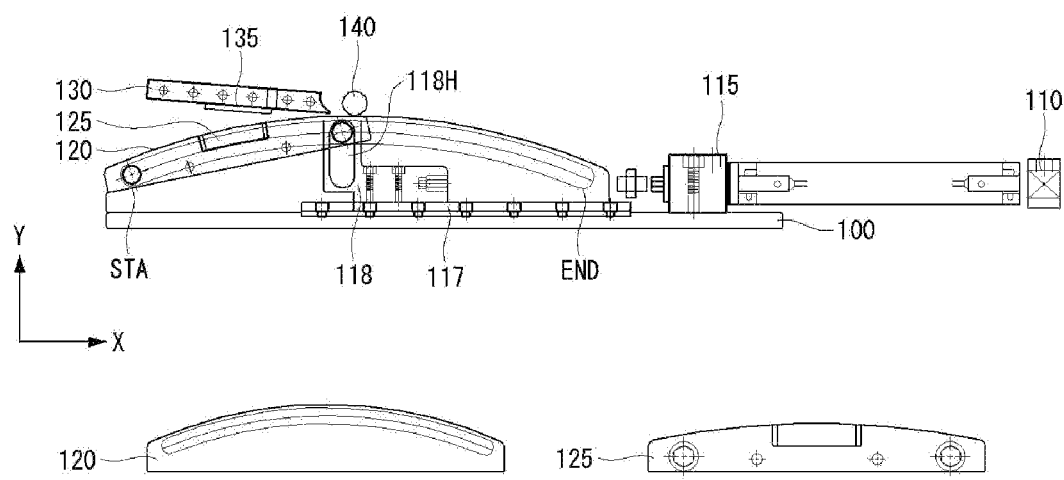
Figure 13:
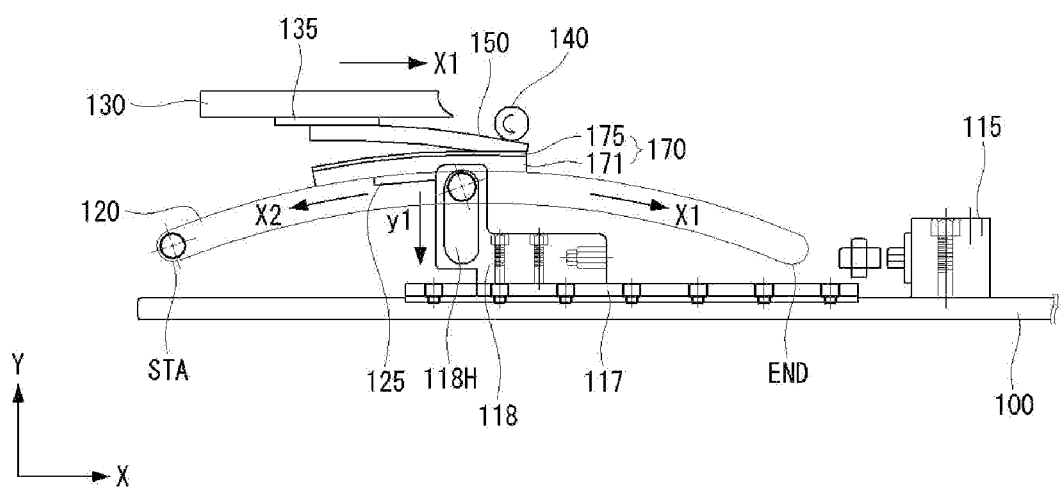
FIG. 13 illustrates a lamination process using the substrate attachment device of the display device according to the third embodiment of the invention.

FIGS. 11 and 12 schematically illustrate a configuration of a substrate attachment device of a display device according to a third embodiment of the invention. FIG. 13 illustrates a lamination process using the substrate attachment device of the display device according to the third embodiment of the invention.

The substrate attachment device of the display device according to the third embodiment of the invention includes a base unit 100, a motor unit 115, an operation unit 110, a rotation shaft 117, a movement unit 118, a guide unit 120, a first support unit 125, a second support unit 130, and a roller unit 140.

The operation unit 110 is a device for operating the motor unit 115, the movement unit 118, the guide unit 120, the first support unit 125, the second support unit 130, and the roller unit 140. A position of the operation unit 110 is not limited to FIGS. 11 and 12.

The motor unit 115 transfers a rotation force to the rotation shaft 117 and rotates so that the first support unit 125 moves forward in x1-direction or moves backwards in x2-direction along the guide unit 120. When the motor unit 115 rotates, the rotation shaft 117 rotates. Hence, the movement unit 118 causes the first support unit 125 to move forward or backwards.

The movement unit 118 causes the first support unit 125 to move forward or backwards depending on the rotation force of the rotation shaft 117. The movement unit 118 has a 'L' shape. A vertical part of the movement unit 118 has an inner space 118H, into which a wheel installed in the front of the first support unit 125 is inserted. A horizontal part of the movement unit 118 has a saw-toothed gear so that the movement unit 118 moves forward or backwards depending on the rotation force of the rotation shaft 117.

The guide unit 120 is installed on the base unit 100. The guide unit 120 has a flat lower part and a semicircular upper part (i.e., a curved upper part). The upper part of the guide unit 120 includes a pair of curve rails.

The first support unit 125 is installed on the guide unit 120. More specifically, the first support unit 125 is installed on the pair of curve rails formed on the upper part of the guide unit 120. The first support unit 125 includes wheels rotating on the pair of curve rails. For example, the first support unit 125 may include two front wheels and two rear wheels. However, the embodiment of the invention is not limited thereto. The first support unit 125 moves forward in the x1-direction or moves backwards in the x2-direction along the guide unit 120 by the movement unit 118. The first support unit 125 loads the cover substrate 170 at a start point STA and releases the display panel 150 and the cover substrate 170, which are attached to each other, at an end point END. The first support unit 125 functions to move the curved cover substrate 170. The upper part of the first support unit 125 has the same curved surface as the cover substrate 170. The first support unit 125 may include an adsorption part for adsorbing the curved cover substrate 170, but the adsorption part may be omitted.

The second support unit 130 is installed on the guide unit 120. More specifically, the second support unit 130 may be installed in a floating state by a holder installed separately from the guide unit 120 or by a holder installed along with the guide unit 120. The embodiment of the invention is not limited thereto. The second support unit 130 moves forward in the x1-direction or moves backwards in the x2-direction in synchronization with the first support unit 125. The second support unit 130 functions to move the display panel 150. The second support unit 130 may move from side to side or up and down depending on a position of the display panel 150. The second support unit 130 may have a flat lower surface in the same manner as the display panel 150. The second support unit 130 may include an adsorption part 135 for adsorbing the display panel 150 on a lower part of the second support unit 130. The adsorption part 135 may adsorb the display panel 150 in a vacuum adsorption manner. The embodiment of the invention is not limited thereto.

The roller unit 140 is installed on the guide unit 120. More specifically, the roller unit 140 may be installed in a floating state by a driver installed separately from the guide unit 120 or by a driver installed along with the guide unit 120. The embodiment of the invention is not limited thereto. The roller unit 140 moves downwards in y1-direction or moves upwards in y2-direction. The roller unit 140 is positioned in a standby region positioned in the y2-direction, but the roller unit 140 moves to a process region positioned in the y1-direction when the curved cover substrate 170 and the display panel 150 approach the roller unit 140. Alternatively, the roller unit 140 may perform only a rotation movement in a fixed state. The roller unit 140 rotates, so that the curved cover substrate 170 is attached to the display panel 150.

A process for attaching the curved cover substrate 170 and the display panel 150 using the substrate attachment device of the display device according to the third embodiment of the invention is described below with reference to FIG. 13.

The curved cover substrate 170 is loaded on the first support unit 125, and the display panel 150 is loaded on the second support unit 130. When the curved cover substrate 170 and the display panel 150 are loaded on the first and second support units 125 and 130, the curved cover substrate 170 and the display panel 150 are aligned with each other. A vision camera may be used to align the curved cover substrate 170 and the display panel 150. The embodiment of the invention is not limited thereto. Namely, the substrate attachment device according to the third embodiment of the invention includes the vision camera. However, because the vision camera may be readily understood by those skilled in the art, the vision camera was not shown in the drawings.

The first and second support units 125 and 130 move in the x1-direction so as to transfer the curved cover substrate 170 and the display panel 150 loaded thereon to the process region of the roller unit 140. When the curved cover substrate 170 and the display panel 150 approach the roller unit 140 through the movement of the first and second support units 125 and 130, the roller unit 140 rotates in R1-direction, so that the curved cover substrate 170 is attached to the display panel 150 using the adhesive layer 175. After the process for attaching the curved cover substrate 170 and the display panel 150 is completed, the first support unit 125 transfers the curved cover substrate 170 and the display panel 150 to the end point END. In this instance, the second support unit 130 moves up to the process region of the roller unit 140.

According to the above-described structure shown in FIG. 4 or 5, the subpixels are formed on the one surface of the flexible substrate 151, and the protection film 152 is attached to the one surface of the flexible substrate 151. Hence, the display panel 150 may be formed. As shown in FIG. 13, the cover substrate 170 to be attached to the display panel 150 is loaded on the first support unit 125, which moves along the curvedly positioned guide unit 120. The display panel 150 is loaded on the second support unit 130. The first and second support units 125 and 130 move to the process region of the roller unit 140. The roller unit 140 rotates so that the curved cover substrate 170 is attached to the display panel 150.

As described above, the curved cover substrate 170 is attached to the display panel 150 using the substrate attachment device according to the third embodiment of the invention, and thus the display panel 150 having the curved surface may be manufactured as shown in FIG. 6.

As described above, the embodiment of the invention attaches the curved cover substrate to the display panel while the curved cover substrate and the display panel smoothly contact each other along the guide unit, thereby greatly reducing the possibility of generation of bubbles between the display panel and the curved cover substrate. Further, the embodiment of the invention has an effect to provide the substrate attachment device of the display device capable of increasing the manufacturing yield and the method for manufacturing the display device using the same. The embodiment of the invention described that the cover substrate having the curved surface is attached to the display panel. However, the embodiment of the invention may be used to attach other kinds of substrates having a curved surface to a panel or a substrate.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A substrate attachment device of a display device comprising:
    a guide unit which is curvedly disposed;
    a first support unit configured to move forward and backwards along the guide unit and transfer a cover substrate having a curved surface;
    a second support unit which is disposed on the guide unit, moves forward and backwards, and transfers a display panel; and
    a roller unit configured to rotate so that the cover substrate having the curved surface is attached to the display panel.

2. The substrate attachment device of claim 1, wherein when the cover substrate and the display panel approach the roller unit, the roller unit rotates in a fixed state.

3. The substrate attachment device of claim 1, wherein when the cover substrate and the display panel approach the roller unit, the roller unit moves from a standby region to a process region and rotates.

4. The substrate attachment device of claim 1, wherein the first support unit has the same curved surface as the cover substrate.

5. The substrate attachment device of claim 1, wherein the second support unit adsorbs the display panel in a vacuum adsorption manner.

6. The substrate attachment device of claim 1, wherein the guide unit includes a pair of curve rails,
    wherein the first support unit includes a wheel rotating on the pair of curve rails.

7. The substrate attachment device of claim 1, wherein the guide unit includes a pair of curve rails,
    wherein the first support unit includes a self-module performing a contactless movement on the pair of curve rails.

8. The substrate attachment device of claim 1, wherein the guide unit includes a pair of caterpillar rails,
    wherein the first support unit includes a belt rotating along the pair of caterpillar rails.

9. A method for manufacturing a display device using a substrate attachment device of the display device, the method comprising:
    forming subpixels on one surface of a flexible substrate;
    attaching a protection film to the one surface of the flexible substrate to form a display panel;
    loading a cover substrate having a curved surface to be attached to the display panel on a first support unit, which moves along a curvedly positioned guide unit;
    loading the display panel on a second support unit;
    transferring the first and second support units to a process region; and
    rotating a roller unit so that the cover substrate having the curved surface is attached to the display panel when the first and second support units approach the process region.

10. The method of claim 9, wherein the guide unit includes a pair of curve rails,
    wherein the first support unit includes a wheel rotating on the pair of curve rails.

11. The method of claim 9, wherein the guide unit includes a pair of curve rails,
    wherein the first support unit includes a self-module performing a contactless movement on the pair of curve rails.

12. The method of claim 9, wherein the guide unit includes a pair of caterpillar rails,
    wherein the first support unit includes a belt rotating along the pair of caterpillar rails.

13. The method of claim 9, when the cover substrate and the display panel approach the roller unit, the roller unit rotates in a fixed state.

14. The method of claim 9, wherein when the cover substrate and the display panel approach the roller unit, the roller unit moves from a standby region to a process region and rotates.

15. The method of claim 9, wherein the first support unit has the same curved surface as the cover substrate.

16. The method of claim 9, wherein the second support unit adsorbs the display panel in a vacuum adsorption manner.

* * * * *